(12) United States Patent
Derksen et al.

(10) Patent No.: US 7,936,447 B2
(45) Date of Patent: May 3, 2011

(54) LITHOGRAPHIC APPARATUS AND DEVICE MANUFACTURING METHOD

(75) Inventors: Antonius Theodorus Anna Maria Derksen, Eindhoven (NL); Erik Marie José Smeets, Prinsenbeek (NL); David Christopher Ockwell, Waalre (NL); Henricus Jozef Peter Lenders, Heibloem (NL)

(73) Assignee: ASML Netherlands B.V., Veldhoven (NL)

( * ) Notice: Subject to any disclaimer, the term of this patent is extended or adjusted under 35 U.S.C. 154(b) by 552 days.

(21) Appl. No.: 11/429,451

(22) Filed: May 8, 2006

(65) Prior Publication Data

US 2007/0258076 A1 Nov. 8, 2007

(51) Int. Cl.
*G03B 27/58* (2006.01)
*H01L 21/76* (2006.01)

(52) U.S. Cl. .......................................... 355/74; 438/435
(58) Field of Classification Search .................... 355/74, 355/72, 67; 438/435
See application file for complete search history.

(56) References Cited

U.S. PATENT DOCUMENTS

| | | | | |
|---|---|---|---|---|
| 4,904,012 A | 2/1990 | Nishiguchi et al. | ........... | 294/64.1 |
| 5,361,121 A | 11/1994 | Hattori et al. | ................... | 355/50 |
| 5,635,999 A * | 6/1997 | O'Brien et al. | ............... | 396/508 |
| 5,712,698 A * | 1/1998 | Poschenrieder et al. | ......... | 355/71 |
| 5,760,881 A | 6/1998 | Miyazaki et al. | ................ | 355/71 |
| 6,040,894 A * | 3/2000 | Takahashi | ........................ | 355/53 |
| 6,078,381 A | 6/2000 | Suzuki | ............................ | 355/53 |
| 6,172,738 B1 * | 1/2001 | Korenaga et al. | ............... | 355/53 |
| 6,680,774 B1 | 1/2004 | Heinle | .............. | 355/72 |
| 7,105,457 B2 * | 9/2006 | Takeuchi | ...................... | 438/735 |
| 2001/0028446 A1 * | 10/2001 | Higashiki | ........................ | 355/52 |
| 2002/0195539 A1 * | 12/2002 | Nakao et al. | ................ | 250/201.2 |
| 2003/0117602 A1 * | 6/2003 | Kobayashi et al. | ............. | 355/53 |
| 2003/0197841 A1 * | 10/2003 | Araki et al. | ..................... | 355/50 |
| 2004/0090611 A1 * | 5/2004 | Choi et al. | ...................... | 355/75 |

FOREIGN PATENT DOCUMENTS

| | | | |
|---|---|---|---|
| JP | 5-335207 | | 12/1993 |
| JP | 10189531 A | * | 7/1998 |
| JP | 2001313269 A | * | 11/2001 |
| JP | 2004-146732 A | | 5/2004 |
| JP | 2004-266125 A | | 9/2004 |
| JP | 2005-045160 A | | 2/2005 |
| JP | 2006-040915 A | | 2/2006 |

OTHER PUBLICATIONS

English Translation of Notification of Reason(s) for Refusal issued by Japanese Patent Office in Japanese Patent Application No. 2007-123051 on Oct. 26, 2010.

* cited by examiner

*Primary Examiner* — Georgia Y Epps
*Assistant Examiner* — Ryan Howard
(74) *Attorney, Agent, or Firm* — Pillsbury Winthrop Shaw Pittman LLP

(57) ABSTRACT

A masking apparatus for preventing irradiation of an outer region of a substrate during lithography is disclosed. The masking apparatus includes a mask that includes a plurality of discrete segments arranged to form a continuous ring shaped mask positioned between an outer region of a substrate and an illumination system.

8 Claims, 8 Drawing Sheets

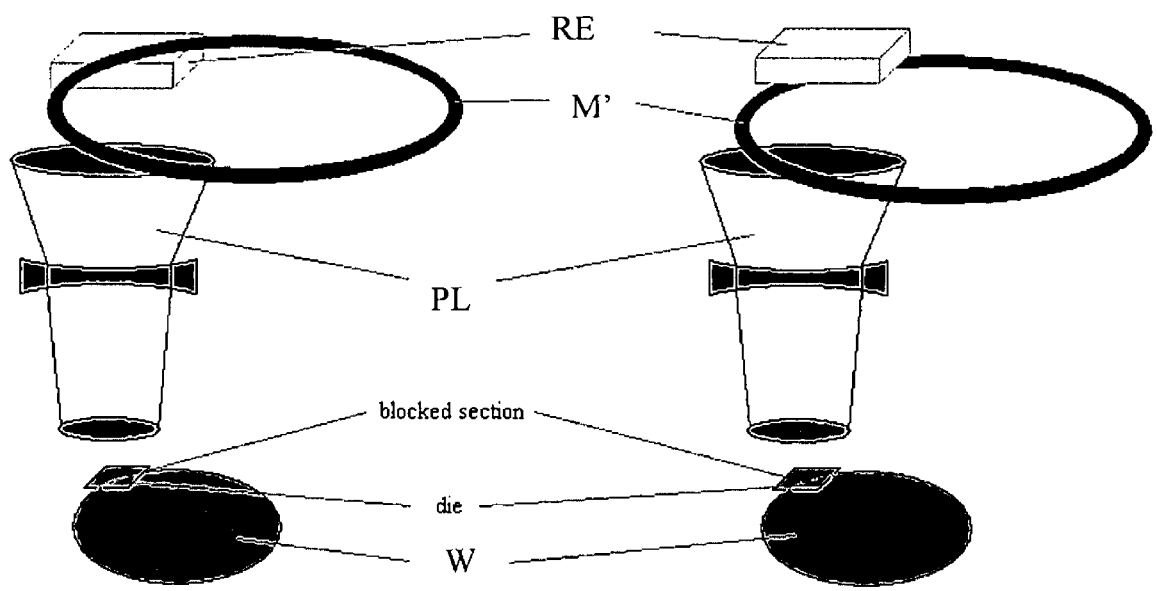
FIG 10A  FIG 10B

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to herein as a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In some circumstances it may be desirable to prevent irradiation (which may also be referred to as preventing exposure) of an outer region of the substrate. The outer region may for example be a peripheral region (e.g. edge region) of the substrate.

One such circumstance occurs, for example, when "packaging" an IC (i.e. mounting onto a board). It has been conventional to use wires to connect an IC to a board. However, in recent years the distance between locations to which wires are to be bonded has become progressively smaller, and it has been more difficult to use wire bonding. A process which is known as flip-chip bumping is increasingly used to connect ICs to boards instead of using connection wires. In flip-chip bumping, solder (or some other metal) is provided at specific locations on each IC on a substrate. The substrate is inverted and bonded to a board, for instance by heating the solder such that it melts and then allowing it to cool again.

The solder (or other metal) may itself be provided at specific locations by a lithographic process. In such a process the substrate, which may comprise a plurality of ICs, is provided with a layer of radiation-sensitive material (resist). A lithographic apparatus may be used to irradiate the resist and the resist subsequently selectively removed at the specific locations in which a solder "bump" is needed (the skilled person will appreciate that these regions may be either irradiated regions or non-irradiated regions, depending upon whether a positive or negative resist is used). The IC may then undergo an electroplating step to apply the solder to the IC at the specific locations. As the skilled person will appreciate, the process of electroplating requires an electrical connection to be made to the article onto which metal is to be deposited. Accordingly, the electroplating step should utilize a resist free area of the substrate for making an electrical connection.

While it may be sufficient to provide a single resist free point for making such an electrical connection, it can be advantageous to provide a continuous ring of resist free substrate around the outer region of the substrate. Such an arrangement may enable a more reliable electrical connection. Furthermore, a continuous resist free ring around the outer edge of the substrate allows an electroplating bath to be conveniently formed using the resist free region. For example, an upstanding wall may be provided on the resist free region of the substrate, such that the substrate forms the base of the electroplating bath.

The resist free region of the substrate may be provided by chemically removing resist, for example by spraying solvent. When a positive resist is used the exposed portion may be provided by irradiating the outer portion of the resist, for example by means of an edge bead removing tool, prior to the step of selectively removing resist. This process is a more accurate method of removal than chemical spraying. Accordingly, it would be useful to prevent irradiation of an outer region of the resist when using a negative resist, such that the resist in this region will subsequently be removed.

Accordingly, a method and apparatus for mechanically masking a workpiece to form an exposure exclusion region (i.e. a non-irradiated region) has been proposed in U.S. Pat. No. 6,680,774 B1. This document teaches an arrangement in which a mask, in the form of a ring of "opaque" material is placed either immediately above or in direct contact with the upper surface of the workpiece (i.e. the substrate), prior to the workpiece being moved into an exposure location for exposure with radiation. However, the applicants have identified several potential problems with the arrangement of this prior art.

Placement of the mask in U.S. Pat. No. 6,680,774 B1 requires the ring to be transferred above and across the width of the substrate. This action requires a relatively large movement of the mask relative to the substrate which provides a time constraint into the operation, especially as the mask must be placed on the substrate following loading onto a substrate support and subsequently removed before the substrate can be unloaded. Furthermore, as the mask is transferred across the substrate there is always a risk of contamination of the substrate, for example from dust or other particles falling from the mask. Another disadvantage is that if the ring is not accurately placed in proximity to the substrate, the excluded region may not be sufficiently accurately defined, which could lead to an inconsistent edge region. The definition of the excluded region may also be adversely affected by the shadow of the mask and by the defocus area of the mask.

It is, therefore, desirable to provide an alternate method and/or apparatus for preventing irradiation of an edge region of the substrate, which may overcome or mitigate at least one of the disadvantages of the prior art.

SUMMARY

According to an aspect of the invention, there is provided a masking apparatus for preventing irradiation of an outer region of a substrate during lithography. The masking apparatus comprises a mask comprising a plurality of discrete segments arranged to form a continuous ring shaped mask positioned between an outer region of a substrate and an illumination system.

According to another aspect of the invention, there is provided a lithographic apparatus comprising: an illumination system for providing a projection beam of radiation; a support structure for supporting a patterning device, the patterning device serving to impart the projection beam with a pattern in its cross-section; a substrate table for holding a substrate; a projection system for projecting the patterned beam onto a target portion of the substrate; and a masking apparatus comprising a mask comprising a plurality of discrete segments arranged to form a continuous ring shaped mask positioned between an outer region of the substrate and the illumination system.

According to a further aspect of the invention, there is provided a device manufacturing method comprising the steps of: providing a substrate; projecting a beam of radiation onto a target portion of the substrate; and positioning a plurality of discrete mask segments over an outer region of the substrate to form a continuous mask between the beam of radiation and the outer region of the substrate to prevent irradiation of the outer region of the substrate.

According to another aspect of the invention, there is provided a lithographic apparatus comprising: an illumination system for providing a projection beam of radiation; a substrate table for holding a substrate; a projection system for projecting the projection beam onto a target portion of the substrate; a mask for preventing irradiation of an outer region of the substrate; and a mask support for coupling the mask to the substrate table, the mask support comprising a mask drive mechanism arranged to adjust the position of the mask relative to the substrate table.

According to another aspect of the invention, there is provided a lithographic apparatus comprising: an illumination system for providing a projection beam of radiation; a support structure for supporting a patterning device, the patterning device serving to impart the projection beam with a pattern in its cross-section; a substrate table for holding a substrate; a projection system for projecting the patterned beam onto a target portion of the substrate; and a ring shaped mask located between the illumination system and the projection system, the mask being arranged to be selectively positioned within a portion of the projection beam to prevent the projection beam from irradiating an outer region of the substrate.

According to another aspect of the invention, there is provided a mask handling system for selecting a suitably sized mask from a selection of stored masks each mask comprising a plurality of discrete segments arranged to preventing irradiation of an outer region of a particular substrate during lithography.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit. When packaging an IC by flip-chip bumping, the pattern imparted to the projection beam may correspond to the desired solder bump locations.

The patterning device may be transmissive or reflective. Examples of patterning devices include masks, programmable mirror arrays, and programmable LCD panels. Patterning devices or reticles are well known in lithography, and include reticle types such as binary, alternating phase-shift, and attenuated phase-shift, as well as various hybrid reticle types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as needed and which may ensure that the patterning device is at a desired position, for example with respect to the projection system. Any use of the terms "reticle" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more reticle tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the reticle and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 10A and 10B depicts a lithographic apparatus according to a further embodiment of the invention.

EMBODIMENTS

Figure 1:
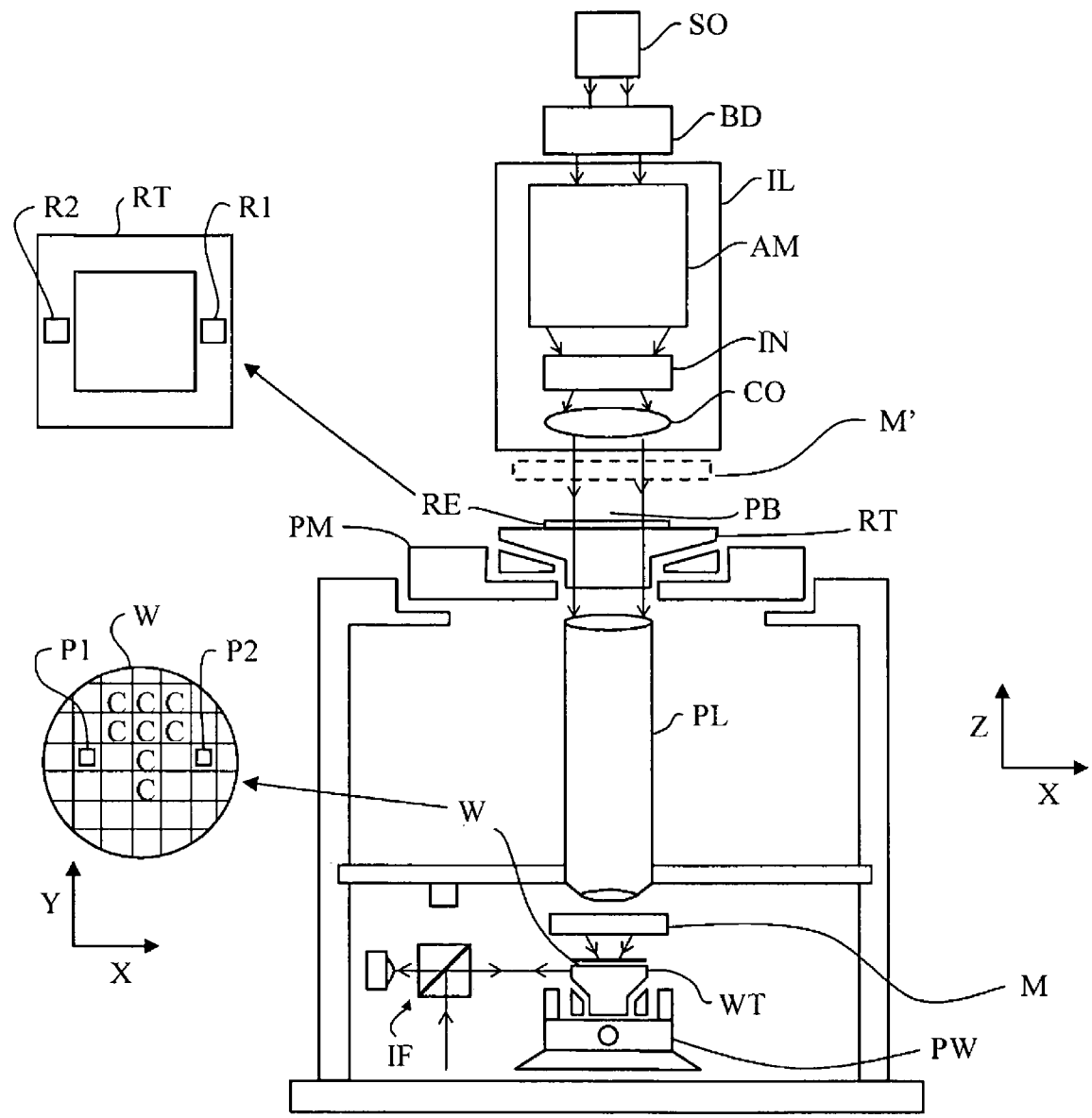
FIG. 1 depicts a lithographic apparatus according to an embodiment of the invention.

FIG. 1 schematically depicts a lithographic apparatus according to a particular embodiment of the invention. The apparatus comprises: an illumination system (illuminator) IL for providing a projection beam PB of radiation (e.g. UV radiation); a first support structure (e.g. a reticle table) RT for supporting a patterning device (e.g. a reticle) RE and connected to first positioner PM for accurately positioning the patterning device with respect to item PL; a substrate table (e.g. a wafer table) WT for holding a substrate (e.g. a resist-coated wafer) W and connected to second positioner PW for accurately positioning the substrate with respect to item PL; and a projection system (e.g. a refractive projection lens) PL for imaging a pattern imparted to the projection beam PB by the patterning device RE onto a target portion C (e.g. comprising one or more dies) of the substrate W.

As here depicted, the apparatus is of a transmissive type (e.g. employing a transmissive reticle). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if needed, may be referred to as a radiation system.

The illuminator IL may comprise adjustor AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the reticle RE, which is held on the reticle table RT. Having traversed the reticle RE, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the reticle RE with respect to the path of the beam PB, e.g. after mechanical retrieval from a mask library, or during a scan. In general, movement of the object tables RT and WT will be realized with the aid of a long-stroke module (coarse positioning) and a short-stroke module (fine positioning), which form part of the positioners PM and PW. However, in the case of a stepper (as opposed to a scanner) the reticle table RT may be connected to a short stroke actuator only, or may be fixed. Reticle RE and substrate W may be aligned using reticle alignment marks R1, R2 and substrate alignment marks P1, P2.

The depicted apparatus can be used in the following preferred modes:

1. In step mode, the reticle table RT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the reticle table RT and the substrate table WT are scanned synchronously while a pattern imparted to the projection beam is projected onto a target portion C (i.e. a single dynamic exposure). The velocity and direction of the substrate table WT relative to the reticle table RT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the reticle table RT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as needed after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

The lithographical apparatus described above may be used for forming solder bumps in flip-chip bumping. The reticle RE is provided with a pattern which comprises the desired solder bumps. This pattern is imaged onto a thick layer of resist (i.e. thicker than a layer of resist used in conventional lithography) which is provided on the substrate. The resist is then developed and processed such that recesses are formed at the locations where solder bumps are needed. Solder is then electroplated in the recesses in the resist. The resist is then removed, so that solder bumps project upwards from the uppermost surface of the substrate.

Accordingly, it will be appreciated that references herein to 'substrate' are intended to include a substrate that already contains multiple processed layers (for example to form an IC).

As discussed above, it may sometimes be desired to mask an outer region of the substrate. For example this may be desirable to enable further processing when flip-chip bumping. Accordingly, in embodiments of the invention a mask M is provided between the projection system PL and the substrate W, as shown in FIG. 1.

Figure 2A:
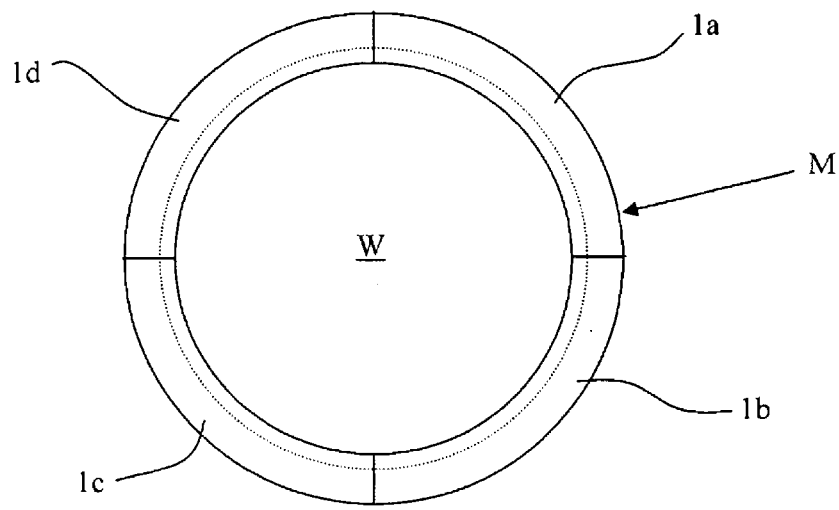
FIGS. 2A, 2B and 2C depict a masking apparatus according to an embodiment of the invention.

In embodiments of the invention a mask M is provided which consists of a plurality of discrete mask segments, which in combination may form a continuous ring shaped mask (as will be described in further detail below). As shown in FIG. 2A, the mask may for example comprise four discrete mask segments 1a, b, c and d. It will be appreciated, however, that the mask may comprise more than or fewer than four discrete segments.

Each of the four discrete segments 1a, b, c and d of the mask M are generally arcuate in shape and comprise a quadrant of a ring (or annulus).

The mask may be formed from any material which is opaque (i.e. impenetrable) to the particular form of radiation of the projection beam PB. For example the mask may be chosen to be opaque to UV radiation or to Deep UV radiation. The mask may for example be formed of stainless steel, anodised aluminium or silicon. The skilled person will appreciate that, in addition to being opaque, these materials are compatible with a cleanroom environment. Accordingly, the mask may be formed of any cleanroom compatible opaque material.

In some embodiments, the mask may for example be in the form of a composite, layered or laminate material. For example the mask may comprise an inner lightweight material coated with an external layer of material chosen so as to provide the appropriate properties for cleanroom compatibility and/or radiation compatibility.

The mask may be formed of an expandable material, so as to enable the physical size of the mask to be varied. For example the segments of the mask may comprise inflatable segments. For example, the mask may be formed of an expandable latex material or the like. For radiation compatibility (and/or cleanroom compatibility) the mask may for example comprise an inflatable latex body covered with a suitable material. For example, metal may be deposited on the latex material or the latex material may be arranged to drive solid pieces of material (which may not have enough strength by themselves, for example 0.1 mm thick mask elements).

In FIG. 2A the mask M is shown in a first position in which the four discrete segments 1a, b, c and d cooperate to form a continuous ring shaped mask, this position may conveniently be referred to as the 'closed' position. As will be described below the 'closed' position may be used to prevent irradiation of an outer portion of a substrate during lithographic processing.

The inner diameter of the continuous ring shape mask M (i.e. in the closed position) is suitably sized to be less than the outside diameter of a corresponding substrate W (so that the mask M will overlap with an outer portion around the outer region of the substrate when the centers of the substrate and mask are in alignment). The difference between the outer diameter of the substrate W and the inner diameter of the mask M will depend on the width of the outer region that is intended to be masked from the projection beam. The width of the outer region, which may be referred to as the edge clearance, is a factor in determining the desired radial distance d of the overlap between the mask M and the substrate W. In fact, the distance (d) of the inner diameter of the mask M inside the outer diameter of the substrate W may be determined from the edge clearance (ec), the height (h) of the ring above the substrate and the optical properties of the incoming projection beam (i.e. the numerical aperture NA) by using the following equation:

$$d = ec + h \times \tan(\sin [NA]) \qquad (1)$$

A typical edge clearance may for example be 1, 2, or 3 mm (for example 3 mm may be a typical value). The height of the ring above the substrate (h) may for example typically be 2 mm. A typical value of the numerical aperture (NA) may for example be 0.2.

The ring shaped mask M and the substrate W can for example be aligned in use such that their respective centers are generally aligned along an axis extending perpendicularly to the plane of substrate W. By aligning the centers of the mask M and substrate W along an axis extending perpendicularly to the plane of substrate W the mask can provide an outer region having uniform dimensions, such as for example the thickness of the outer region.

Figure 2B:
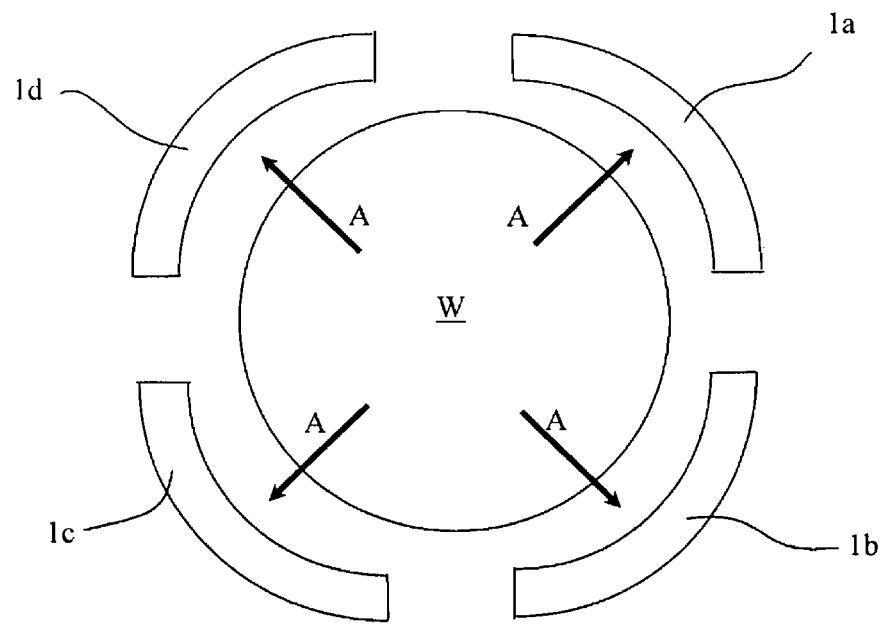

As shown in FIG. 2B, in use the discrete segments 1a, b, c and d are arranged so that each segment can be displaced in the direction of arrows A relative to an adjacent segment. Arrows A extend in the radial direction of the substrate W. Accordingly, the mask M can be transformed from a first position (the 'closed' position) to a second position in which the segments are no longer in cooperation to form a continuous mask, this position may conveniently be referred to as the 'open' position. In the open position the displacement of the segments 1a, b, c and d in the direction of arrows A has increased the internal diameter of the mask M such that it is greater that the outer diameter of the corresponding substrate W. Accordingly, the mask M may be arranged in the second position (the 'open' position) so that the inner walls of the mask are located beyond the outer region of the substrate. This movement of the mask M from the first position to the second position may for example allow loading and unloading of a substrate.

The number of discrete segments which form the mask M is a factor in determining the distance over which each segment should be displaced in order for the inner walls of the mask M to be located beyond the substrate W or to clear the substrate W or to provide sufficient room to load a substrate W. The greater the number of discrete segments which form the mask M, the shorter the distance each segment should be moved radially outward, for example in the direction of arrows A, in order to clear the substrate. However, as the number of segments is increased so is the complexity of the apparatus.

Figure 2C:
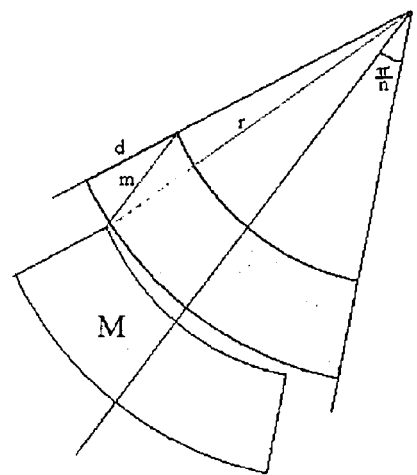

With reference to FIG. 2C, the distance over which the discrete segments should be displaced, for example in the direction of arrows A in FIG. 2B, may be determined from the geometry of the mask M. For example, the movement m in the radial direction of the substrate W may be related to the number of segments (n), the radius r of the substrate W and the distance d of the inner diameter of the mask M inside the outer diameter of the substrate W using the following formula:

$$m = (d-r)\cos\left(\frac{\pi}{n}\right) + \sqrt{r^2\cos^2\left(\frac{\pi}{n}\right) - 2dr\cos^2\left(\frac{\pi}{n}\right) + d^2\cos^2\left(\frac{\pi}{n}\right) + 2dr - d^2} \quad (2)$$

Alternatively, if the number of segments (n) is greater than or equal to 4, the distance may be approximated using the following formula:

$$m = \frac{d}{\cos\left(\frac{\pi}{n}\right)} \quad (3)$$

It will be appreciated from the above description that the use of a segmented mask M enables the mask to be placed over, or removed, from the outer region of the substrate W without transferring any part of the mask M over the central region of the substrate and, therefore, without risking contamination of the substrate with dust or other particles. Furthermore the distances with which the components should be moved is greatly reduced compared to a non-segmented ring shaped mask and may, therefore, reduce the time needed for the operation.

In the embodiment of FIGS. 2A, 2B and 2C, the discrete segments 1a, b, c and d are displaced by a translational movement, which may generally be in the radial direction of the ring shaped mask M. The skilled person will appreciate that several mechanisms may be suitable for controlling the displacement of the mask segments 1a, b, c, and d. For example each segment may be provided with a mechanical actuator for controlling its radial position.

In some embodiments, the actuator may for example simply be arranged to selectively move the discrete segments of the mask M between either the open position or the closed positions. Thus, in such an arrangement the actuator need only be movable between two positions, for example the actuator may be provided with limiters (for example an end-stop) at either extreme of its action. The actuator may for example comprise a piston or solenoid, for example the actuator may comprise an air piston.

In some embodiments, the actuator may be arranged to allow the discrete segments of the mask M to be displaced by a variable distance. For example the discrete mask segments may be positioned relative to the substrate W so as to allow a particular edge overlap between the mask M and substrate W. This arrangement may for example be used to accommodate variations in the position of the substrate W or enable the edge clearance to be varied. Accordingly, the actuator may be arranged to provide a programmable edge clearance (for example the actuator may enable the edge clearance to be selected from 4 to 6 pre-programmed sizes). The actuator may for example comprise a motor and may further comprise a feedback system so as to enable the edge clearance distance to be freely chosen (for example in steps of 0.1 mm or less).

As the actuator speed may be low the mass and volume of the actuator may be small. Thus, the actuator may for example be a piezoelectric actuator. Other forms of actuator may, however, be used and the skilled person would appreciate that the particular actuator chosen will depend upon the particular system, for example the accuracy to which the edge clearance is to be defined.

Figure 3A:
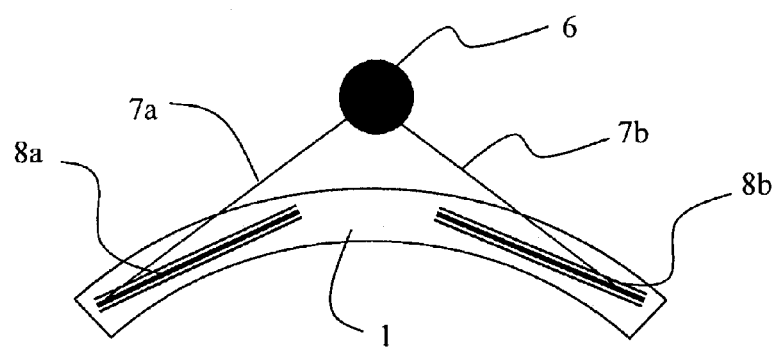
FIGS. 3A and 3B depict an actuator in accordance with an embodiment of the invention.

FIG. 3A shows an actuator arrangement for use in an embodiment. The actuator comprises a drive 6 which is connected to a segment 1 of the mask M by a pair of actuator members 7a and 7b. The actuator members may for example be in the form of linear actuator members. Each of the actuator members 7a and 7b are fixed to the drive 6 at one end and cooperate with the segment 1 of the mask M at their opposite end. The actuator members 7a and 7b may for example be movably connected to the segment 1. For example the segment 1 may be provided with a pair of slide rails 8a and 8b for receiving the actuator members 7a and 7b.

Figure 3B:
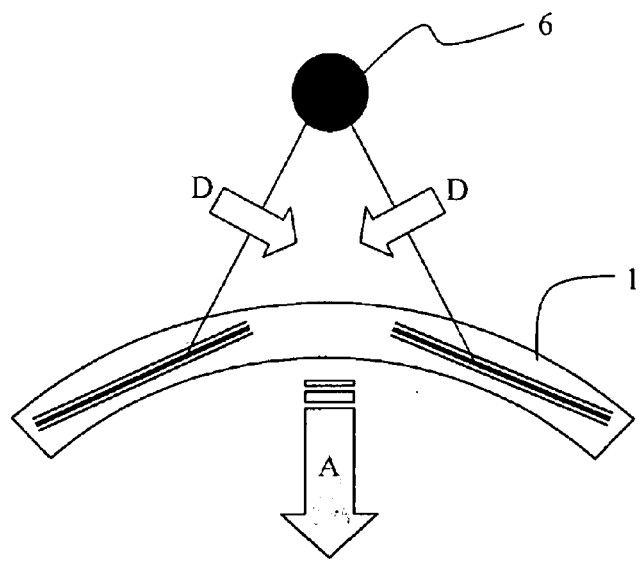

As shown in FIG. 3B, in use the drive 6 is arranged to rotate the actuator members 7a and 7b in the direction of arrows D (about the end fixed to the drive 6). Thus, rotation of the members 7a and 7b can brings the ends of the actuator members together and the members 7a and 7b may each slide within their respective rail 8a and 8b. This action displaces the segment 1 in a linear motion, for example in the direction of arrow A (for example towards the closed position). It will be appreciated that the rotation of the members 7a and 7b in the reverse direction may displace the segment 1 in the reverse linear direction, for example in the reverse direction to arrow A (for example towards the open position).

Figure 4A:
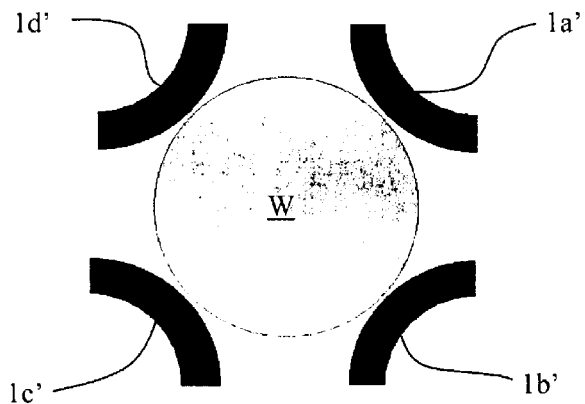
FIGS. 4A, 4B, 4C and 4D depict a masking apparatus according to an embodiment of the invention.
Figure 4B:
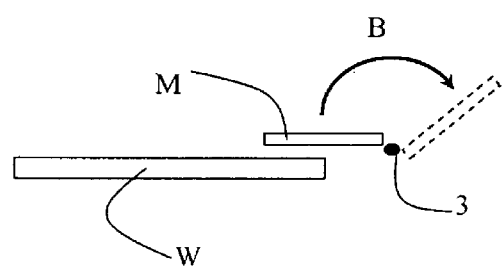

In an alternative embodiment the mask segments 1a', b', c' and d' may be displaced between an 'open' and 'closed' position by a rotational movement rather than a translational radial displacement (as in the embodiment of FIG. 2). FIGS. 4A and 4B show one such embodiment, with the mask segments 1a', b', c' and d' in the open configuration. In this embodiment the segments are rotatable about an axis parallel to the plane of the substrate. Accordingly, by rotating each of the segments about a pivot proximal to the outer diameter of the ring-shaped mask each of the segments may be rotated, for example the segments 1a', b', c' and d' may be rotated by for example 180 degrees (or "flipped") so as to be inverted as shown in FIG. 4A, to allow loading and/or unloading of a substrate. FIG. 4B schematically represents the rotation of one of the segments of the mask M away from the substrate W in the direction of arrow B about pivot point 3.

Figure 4C:
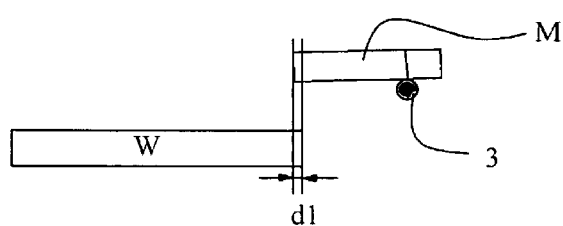
Figure 4D:
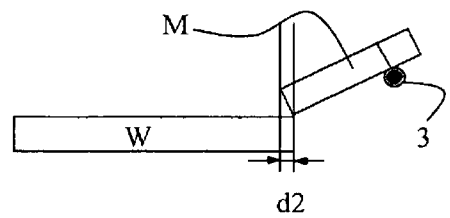
Figure 5:
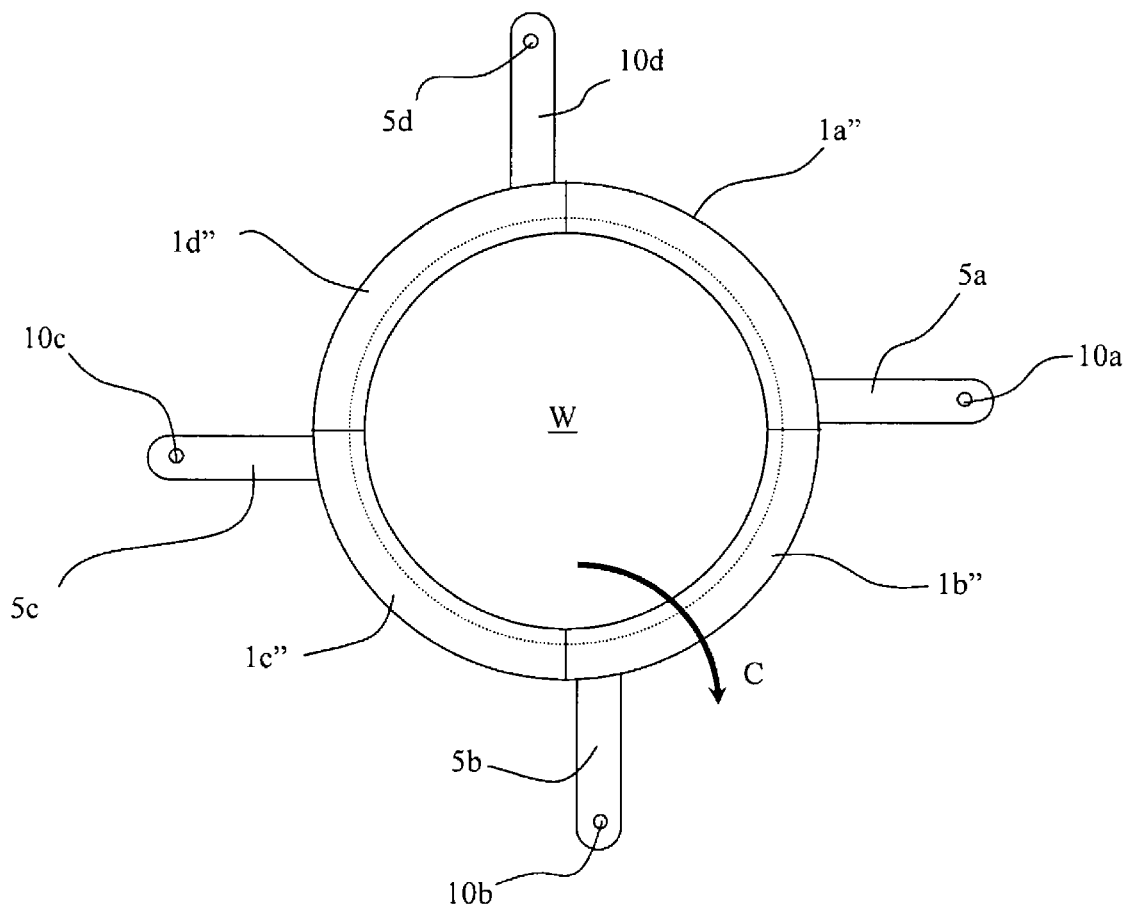
FIG. 5 depicts a masking apparatus according to an embodiment of the invention.

As shown in FIGS. 4C and 4D, rotation of the segments M about a pivot point B may also be used to adjust the edge clearance provided by the mask. In FIG. 4C the mask M is arranged substantially parallel to the plane of the substrate W and the inner diameter of the mask M extends over the substrate W by a distance d1. In FIG. 4D the mask M has been rotated relative to the plane of the substrate W and the innermost portion of the mask M extends over the substrate W by a greater distance d2. Thus, it will be appreciated that the relative rotational angle of the mask M may be used to vary the edge clearance provided. FIG. 5 shows a further embodiment in which the discrete segments 1a", b", c" and d" of the mask M are rotatable about an axis perpendicular to the plane of the substrate. As shown in the particular arrangement of FIG. 5, each of the segments 1a", b", c" and d" may be provided with a pivot arm 5a, b, c and d extending perpendicularly from the outer diameter of the mask M linking the segment to a pivot 10a, b, c, and d. Thus each segments 1a", b", c" and d" may be rotationally displaced about the pivot, as shown for example by the direction of arrow C, to form or break the continuous ring shaped mask (and for example enable loading and unloading of a substrate W).

By providing segments which are each rotatable about an axis perpendicular to the plane of the substrate W it may also for example be possible to provide a continuous ring shaped mask formed of a plurality of discrete segments in the form of a conventional diaphragm arrangement. Accordingly, the mask may for example be provided with an adjustable inner diameter to enable loading and unloading of a substrate W. An adjustable inner diameter may also be arranged to enable a single mask to be used for a variety of different sized substrates. In such an arrangement the length and width of each individual segment would need to be chosen so as to balance the conflict and needs of high mechanical stability and low size and weight.

Figure 6A:
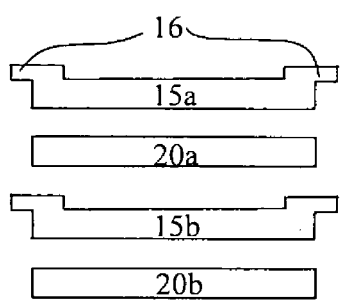
FIGS. 6A and 6B depict another masking apparatus according to an embodiment of the invention.
Figure 6B:
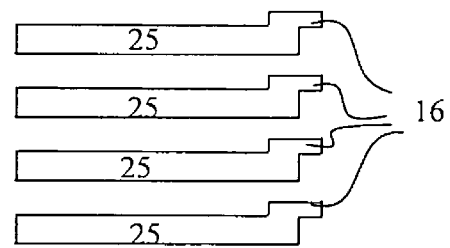

Preferably the discrete segments of the mask M are arranged to partially overlap in the closed position. This simplifies positioning of the discrete segments when forming a continuous ring shaped mask. Accordingly as shown in FIG. 6A, at least some of the discrete segments may be formed with a circumferentially extending portion 16 for overlapping a circumferential end of an adjacent discrete segment. The circumferentially extending portion 16 is arranged so as to be raised above the plane of the adjacent segment. In one arrangement the mask may be formed with two segments 15a and 15b having a circumferentially extending portion 16 at both circumferential ends of the segments 15a and 15b and two segments 20a and 20b positioned therebetween. In the closed position, the circumferentially extending portions 16 of segments 15a and 15b overlap the adjacent circumferential ends of segments 20a and 20b to form the continuous ring shaped mask. Alternatively, the mask M can comprise a plurality of segments, in which each segment 25 may be provided with a circumferentially extending portion 16 at a single end thereof as shown in FIG. 6B.

While the displacement and positioning of the mask segments 1a, b, c and d has been discussed above with respect to a substrate W it will be appreciated that the mask M may be positioned when no substrate is present. For example, the mask M may be positioned with respect to the substrate table WT. Substrates may then subsequently be loaded onto the substrate table with sufficient accuracy that they are correctly located with respect to the mask.

A single lithographic apparatus may be suitable for processing substrates of a variety of sizes, for example conventional substrates may be disks of 200 mm or 300 mm in diameter. Therefore, it may be necessary to interchange the mask M. Therefore, in use a suitably sized ring shaped mask M may be selected from a predetermined selection of masks (e.g. a mask library) and loaded into position, for example engaged with or proximal to the substrate table WT, prior to processing one or more substrates W. A conventional wafer handling robot may be adapted to additionally handle a set of mask segments. The mask segments may for example be loaded separately, in pairs or as a complete ring shaped mask M. The selected mask may be loaded in a closed (i.e. in ring shaped mask configuration) configuration to simplify placement onto (or proximal to) the substrate table WT. When loading the segments in a closed position the mask M may be accurately positioned with respect to the substrate table WT. Therefore in some embodiments for example the subsequent opening and closing of the mask M may need only a simply relatively inaccurate movement with the accuracy of the mask position having been determined during loading.

Accordingly, the segments may conveniently be stored within the apparatus in their ring configuration. This may be achieved for example by providing a disk shaped recess at the storage location, the recess being arranged to receive the mask segments and ensure that they are correctly in the closed configuration. Loading of the mask and the positioning of the individual segments of the mask may be monitored using an optical detector, for example a camera.

Once the mask M has been loaded onto the substrate table WT each discrete segment 1a, b, c and d of the mask M may be displaced to an open position providing clearance between the inner walls of the mask M for loading of a substrate W for processing. The discrete segments 1a, b, c and d may then be displaced to the closed position over the substrate W prior to exposure by the lithographic apparatus. Accordingly, the discrete mask segments form a continuous mask to prevent the beam of radiation from irradiating an outer region of the substrate. Once the substrate W has been irradiated by the projection beam, the discrete mask segments 1a, b, c and d may be displaced beyond the outer region of the substrate (returning to the open position) to allow unloading of the substrate W and, if desired, loading of a further substrate for processing.

Figure 7A:
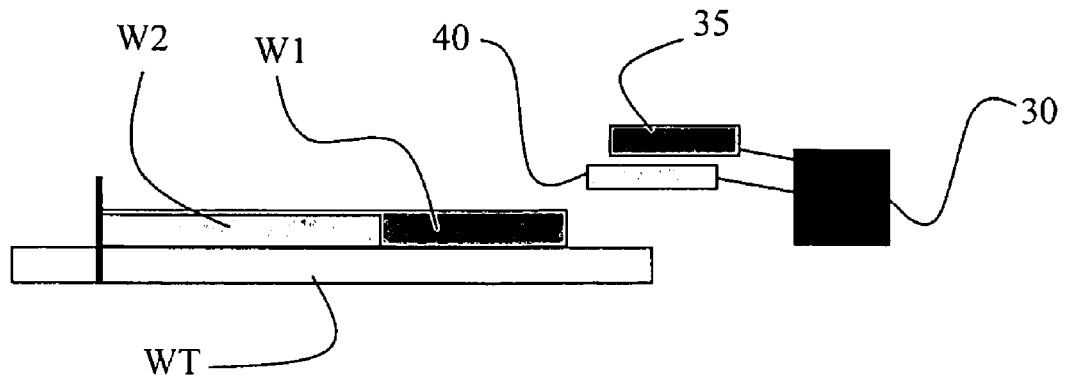
FIGS. 7A, 7B and 7C depict a masking apparatus according to an embodiment of the invention.

In an embodiment of the invention shown in FIG. 7A, a plurality of masks (each formed of a plurality of discrete segments) may be provided for use with different substrates. For example a plurality of mask segments 35, 40 of differing sizes and/or shapes may be provided connected to a single actuator 30. The mask segments may for example be suitable for masking substrates W1 and W2 of differing diameters. For example mask segment 35 may be sized for masking substrate W1 (for example 300 mm diameter) and mask segment 40 may be sized for masking substrate W2 (for example 200 mm diameter). The mask segments may be mounted one above the other in separate planes parallel to the substrate W. The actuator 30 may for example comprise an arrangement of the type described above with reference to FIGS. 3B and 3C comprising a drive and actuator arms.

The segments 35 and 40 may both be driven by a common movement of the drive of the actuator 30. The particular mechanical layout of the segments 35 and 40 will determine the relationship between the movement of the actuator drive and the displacement of the two mask segments 35 and 40. For example for a given movement of the actuator drive first mask segment 35 may be displaced 10 mm and the second mask segment may be displaced 60 mm.

Figure 7B:
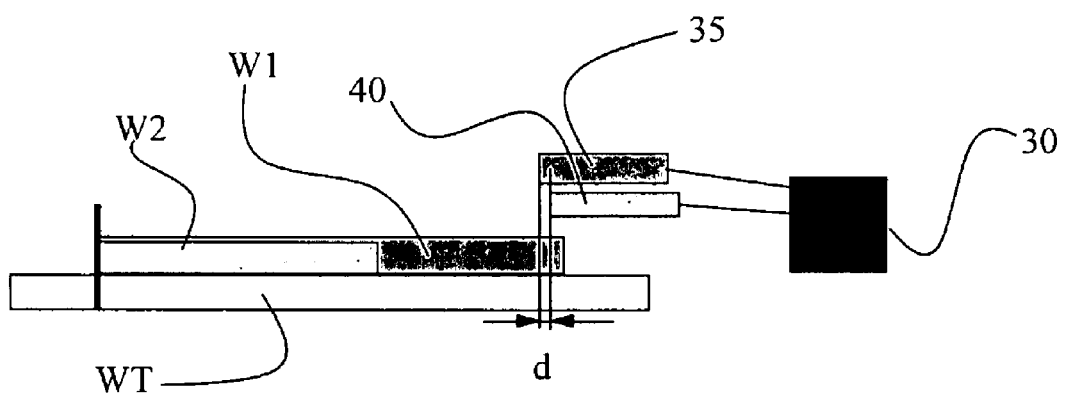

In use, the gear ratio and offset of the actuator 30 may for example be chosen such that both segments are driven by one drive or motor. As shown in FIG. 7B the actuator may for example first displace segment 35 to a position suitable for covering part of the outer region of a substrate W1 (for example a 300 mm wafer).

Figure 7C:
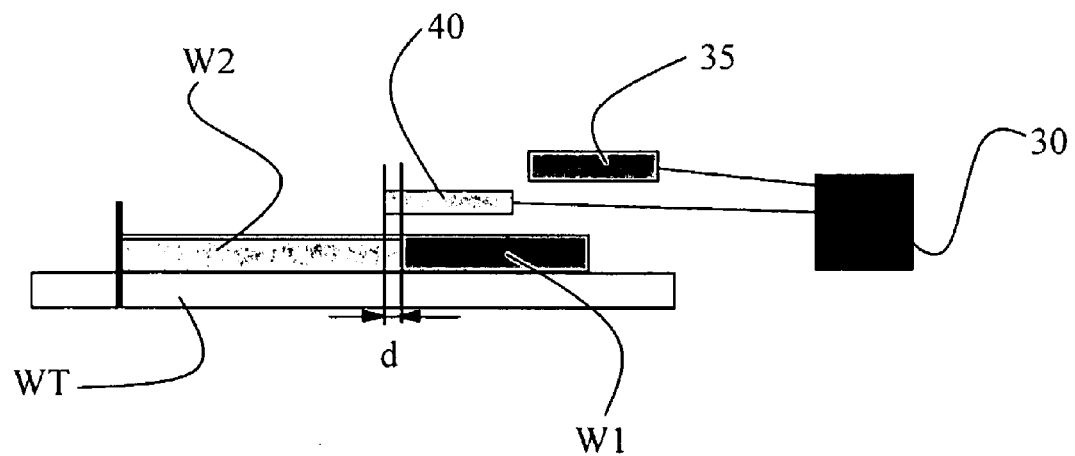

As shown in FIG. 7C, continued activation of the actuator 30 may displace the second segment 40 to a position suitable for covering the outer portion of a smaller diameter substrate W2 (for example a 200 mm wafer). The further activation of the actuator 30 may also further displace the first segment 35 (although it will be appreciated that this movement is beyond the periphery of the smaller substrate W2 and may, therefore, may not be of importance).

Figure 8:
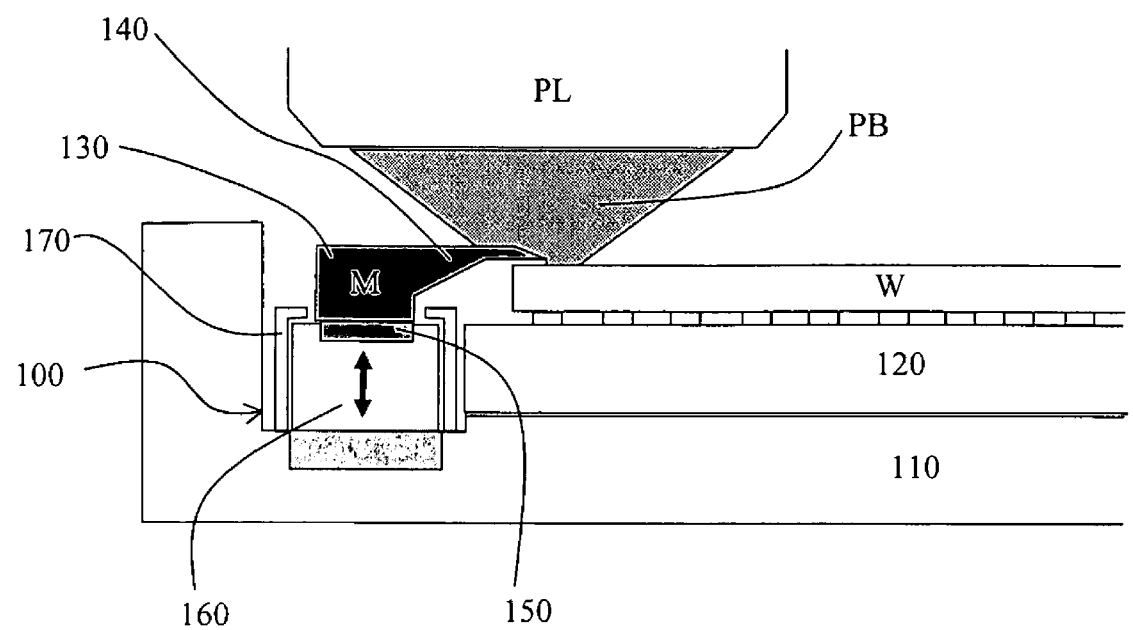
FIG. 8 depicts a mask support according to an embodiment of the invention.

A further aspect of the invention provides a mask support 100 as shown in FIG. 8. The mask support provides coupling of the mask M to the substrate table WT.

The substrate table WT may comprise a mirror block 110 supporting a burl table 120 which in turn supports the substrate W during use. The mask support 100 may for example conveniently be arranged on the mirror block 110 radially outside of, and adjacent to, the burl table 120.

The mask M may be of any suitable form for masking an outer region of a corresponding substrate. For example the mask M may be in the form of a segmented mask (as described above) or may a prior art continuous ring type mask. The mask M, may be provided with a body section 130 for connecting to the mask support, which for example may have an increased cross-sectional thickness. The mask may further comprise an inwardly radially projecting rim 140 adapted to extend, in use, over an outer portion of a substrate W on the substrate table WT. The radially projecting rim 140 may for example be supported in a cantilever manner by the body section 130 of the mask M.

The mask support 100 may for example comprise a mask clamping mechanism 150 for selectively engaging a portion of the mask M. The clamping mechanism 150 may for example be electromagnetic, electrostatic, mechanical or a vacuum mechanism.

The mask support 100 in accordance with an embodiment also comprises a mask drive mechanism 160, arranged to adjust the position of the mask with respect to the substrate table WT. The mask drive mechanism 160 connects the mask clamping mechanism 160 to the substrate table WT. For example the mask drive mechanism 160 may for example be connected to the mirror block 110. The mask drive mechanism 160 may for example comprise a piezoelectric actuator. In some embodiments a plurality of mask drive mechanisms 160 may distributed about the substrate table, for example at circumferentially spaced apart positions to support spaced apart portions of the mask M.

The mask support 100 may further comprise a drive mechanism limiter 170. The limiter 170 may be electronic or mechanical. The limiter 170 may for example comprise a mechanical collar arranged around the drive mechanism 160.

The mask drive mechanism 160 is arranged to adjust the position of the mask in a direction substantially perpendicular to the substrate table (i.e. along the Z axis of the lithographic apparatus). Accordingly the mask drive mechanism 160 may adjust the position of the mask M relative to the substrate table WT. As the mask drive mechanism 160 is a component of the mask support 100 it may for example be used to make mask position adjustments with the mask clamped in position around a substrate W by the mask clamping mechanism 150 (for example the mask drive mechanism 160 may be used for "fine tuning" the position of the mask M). It will be appreciated that by adjusting the height of the mask M by differing amounts circumferentially spaced locations the mask drive mechanism may also provide adjustment of the angular orientation of the mask relative to the substrate table WT. For example the rotational position of the mask about the X and Y axis of the lithographic apparatus may be adjusted (i.e. Rx and Ry).

As the position and orientation of the substrate W relative to the substrate table may be variable, the mask drive mechanism 160 may be used to adjust the mask M for alignment with the substrate W. For example the drive mechanism 160 may be used to adjust the mask M to provide a constant clearance in the Z axis between an upper surface of the substrate W (i.e. the upper surface of the resist on said substrate) and a lower surface of the mask M (this may be referred to as the "height clearance"). It is desirable to provide a minimal height clearance between the mask M and the substrate W, without the mask M contacting the resist layer on the substrate W, so as to provide an accurate masked region. For example the half-shadow of the mask will increase with an increased height clearance. Accordingly, it will be appreciated that if the height clearance between the mask M and the substrate W varies about the circumference of the substrate the resulting edge clearance of the masked region will also vary.

The mask drive mechanism 160 may, alternatively or additionally, be arranged to adjust the position of the mask in a direction substantially parallel to the substrate table (i.e. along the X and Y axis of the lithographic apparatus). The mask drive mechanism 160 may, therefore, be used to align the mask M with a substrate in the X and Y directions so as to ensure that the overlap region between the mask M and the substrate W is uniform around the circumference of the substrate W. For example the mask drive mechanism 160 may be arranged to align the respective centers of the mask M and the substrate W. In embodiments using a segmented ring shaped mask M (as described above), the mask drive mechanism may additionally be arranged to displace the discrete segments of the ring 1a, b, c and d in the radial direction.

The position of the mask M and the adjustments made by the mask drive mechanism 160 may be monitored using a positional sensor. The positional sensor may for example be an optical sensor, for example a camera.

Figure 9:
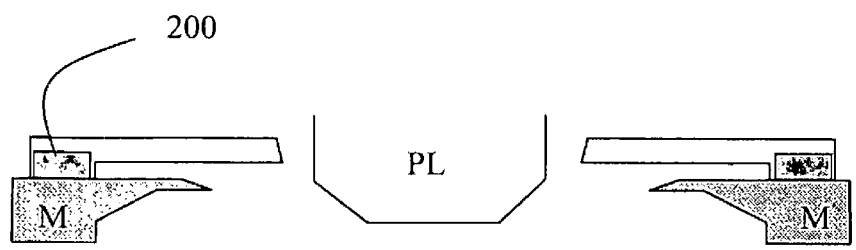
FIG. 9 depicts a mask clamping mechanism according to an embodiment of the invention.

In an embodiment the lithographic apparatus may further comprise a second ring clamping mechanism 200 in a position removed from the substrate table WT, as shown in FIG. 9. The second ring clamping mechanism 200 is arranged to selectively engaging a portion of the mask M. The clamping mechanism 200 may for example be electromagnetic, electrostatic, mechanical or a vacuum mechanism.

The second ring clamping mechanism 200 may for example be positioned above the wafer table (i.e. along the Z axis in the reverse direction of the projection beam PB). The second clamping mechanism 200 may be arranged peripherally to the projection system PS, for example at the end of the projection system PS proximal to the substrate table WT. Accordingly when the mask M is clamped by the second clamp 200 the (generally ring shaped) mask M is outside of the path of the projection beam.

The second clamping mechanism 200 may be used to hold the mask M above the substrate table WT to enable loading and unloading of a substrate W. With the second clamp 200 positioned directly above the substrate table WT it is not necessary to transfer the mask M across the substrate W during loading and unloading. Accordingly the risk of substrate contamination, for example by dust or other particles, is reduced.

In some embodiments the mask drive mechanism 160 of the mask support 100 may be adapted to lift the mask M in the Z direction to enable it to come into contact with the second clamping mechanism 200.

FIGS. 10A and 10B show embodiments in which a mask M' is provided between the illuminator IL and projection system PL (rather than a mask M provided between the projection system PL and the substrate W as in embodiments described above). The mask M' in accordance with this embodiment is shown in broken lines in FIG. 1. The mask M' in this embodiment is proximal to the reticle RE, and may therefore be referred to as being located at "reticle level" of the lithographic apparatus (rather than at the substrate or substrate table level as in the embodiments described above). The mask M' is arranged to be movable in the plane perpendicular to the axis of the projection system (i.e. along the X and Y axis) such that it may be selectively positioned within a portion of the projection beam (as described in further detail below).

The mask M' may for example be positioned within the lithographic apparatus above (i.e. earlier in the path of the projection beam) the reticle RE as shown in FIG. 10A. Alternatively the mask M' may for example be positioned within the lithographic apparatus below (i.e. later in the path of the projection beam PB) the reticle RE as shown in FIG. 10B. As either configuration is suitable optically, the position of the mask M' may be selected to take into account other considerations within the lithographic apparatus (for example the position of a pellicle or the location of a chrome layer which may be provided on the reticle RE).

The mask M' may for example comprise a suitable sized ring shaped mask. The mask M' may also for example comprise a segmented ring or a diaphragm arrangement. A diaphragm arrangement would provide a variable diameter mask and may, therefore, be suitable for accommodating different size substrates or varying the edge clearance provided by the mask.

In a similar way to the mask at substrate level described above, the mask M' may be suitably sized for the substrate being processed so as to provide the desired masked outer region. As the mask M' is positioned before the projection system in the path of the projection beam PB, the reduction (or enlargement) factor of the projection system PL should be considered when sizing the mask M'. For example a ring shaped mask M' may have an inner diameter equal to the outer diameter of the substrate W, less the desired edge clearance, divided by the reduction factor of the lens.

During processing of a substrate W the mask M' may, for example, initially be in a position outside of the path of the projection beam PB during irradiation of inner regions of the substrate W. However, when the lithographic apparatus processes a portion of the substrate W which overlaps onto an outer region (i.e. a region which has been selected to be excluded from irradiation) a portion of the mask M' is mechanically positioned into the path of the projection beam PB, thereby blocking a portion of the projection beam PB (which would otherwise irradiate the outer region of the substrate W). The portion of the mask M' positioned within the projection beam PB may for example have a shape corresponding to the shape of the area to be excluded (but may be suitably scaled to take into account reduction factors as discussed above). Accordingly, as different portions of the substrate W are processed the mask M' will be mechanically manoeuvred to position suitable portions of the mask M' into the path of portions of the projection beam PB.

While specific embodiments of the invention have been described above, it will be appreciated that the invention may be practiced otherwise than as described. The description is not intended to limit the invention.

What is claimed is:

1. A lithographic apparatus comprising:
   an illumination system for providing a projection beam of radiation;
   a substrate table for holding a substrate;
   a projection system for projecting the projection beam onto a target portion of the substrate;
   a mask for preventing irradiation of an outer region of the substrate, the mask comprising a plurality of discrete segments arranged to form a continuous ring; and
   a mask support connected to the substrate table and configured to couple the mask to the substrate table, the mask support comprising a mask drive mechanism arranged to adjust the position of the mask relative to the substrate table in a direction substantially perpendicular to the substrate table.

2. The apparatus of claim 1, wherein the mask drive mechanism is adapted to adjust the position of the mask for alignment with the orientation of the substrate.

3. The apparatus of claim 1, wherein the mask drive mechanism is adapted to adjust the angular orientation of the mask with respect to the plane of the substrate table.

4. The apparatus of claim 1, wherein the mask drive mechanism comprises at least one piezoelectric actuator.

5. The apparatus of claim 1, wherein the mask support comprises a mask clamping mechanism to selectively clamp the mask to the support.

6. The apparatus of claim 1, wherein the apparatus further comprises a mask clamping mechanism arranged to clamp the mask away from the substrate table.

7. The apparatus of claim 6, wherein the mask clamping mechanism is proximal to the projection system and supports the mask outside of the projection beam.

8. The apparatus of claim 1, wherein the apparatus further comprises an optical detector for monitoring the alignment between the substrate and the mask.

\* \* \* \* \*